(12) United States Patent
Sommen

(10) Patent No.: US 12,019,962 B2
(45) Date of Patent: Jun. 25, 2024

(54) METHOD FOR DESIGNING AN ELECTROSTATIC SEPARATING DEVICE OF A MIXTURE OF DIFFERENT MATERIAL GRANULES AND ASSOCIATED DEVICES

(71) Applicant: SKYTECH, Bonnieres-sur-Seine (FR)

(72) Inventor: Pierre Sommen, Pacy-sur-Eure (FR)

(73) Assignee: SKYTECH, Bonnieres-sur-Seine (FR)

( * ) Notice: Subject to any disclaimer, the term of this patent is extended or adjusted under 35 U.S.C. 154(b) by 129 days.

(21) Appl. No.: 17/465,456

(22) Filed: Sep. 2, 2021

(65) Prior Publication Data

US 2022/0067243 A1 Mar. 3, 2022

(30) Foreign Application Priority Data

Sep. 3, 2020 (FR) ...................... 20 08934

(51) Int. Cl.
*G06F 30/25* (2020.01)
*B03C 7/12* (2006.01)

(52) U.S. Cl.
CPC ................ *G06F 30/25* (2020.01); *B03C 7/12* (2013.01); *B03C 2201/24* (2013.01)

(58) Field of Classification Search
CPC ........... G06F 30/25; B03C 7/12; B03C 7/006; B03C 7/003; B29B 17/02
See application file for complete search history.

(56) References Cited

U.S. PATENT DOCUMENTS

| | | | |
|---|---|---|---|
| 2,706,044 A * | 4/1955 | Cook, Jr. ................... | B03C 7/12 209/127.4 |
| 3,493,109 A * | 2/1970 | Carta ...................... | B03C 7/006 209/127.1 |
| 4,797,201 A * | 1/1989 | Kuppers ................... | B03C 7/12 209/127.4 |
| 6,011,229 A | 1/2000 | Geisler et al. | |
| 6,681,938 B1 * | 1/2004 | Link ....................... | B03C 7/003 209/127.4 |

(Continued)

FOREIGN PATENT DOCUMENTS

WO 2007053089 A1 5/2007

OTHER PUBLICATIONS

Schreiber, Andrew; Go (En)fish: Drawing CAD Files From the Patent Eligibility Pool IDEA—The Journal of the Franklin Pierce Center for Intellectual Property vol. 58 No. 1 (2017) p. 1-64 (Year: 2017).*

(Continued)

*Primary Examiner* — Patrick H Mackey
(74) *Attorney, Agent, or Firm* — TROUTMAN PEPPER HAMILTON SANDERS LLP

(57) ABSTRACT

A method for designing one part of an electrostatic separating device of a mixture of different material granules, the method including providing a sorting performance value to be met by the device when at least one predefined mixture is introduced into the device to be sorted, optimizing a value of at least one parameter of the set of parameters relating to the device part by using an optimization technique, the optimization technique including the use of a sorting performance model of the device, and the optimization technique occurring under the constraint that the sorting performed by the device has the given sorting performance value.

6 Claims, 3 Drawing Sheets

(56) References Cited

U.S. PATENT DOCUMENTS

| | | | |
|---|---|---|---|
| 6,927,354 B1* | 8/2005 | Brown | B03C 7/12 |
| | | | 209/579 |
| 2016/0038950 A1 | 2/2016 | Park et al. | |
| 2021/0337724 A1* | 11/2021 | Janke | G06F 17/16 |

OTHER PUBLICATIONS

Rapport De Recherche Prèliminaire issued in corresponding French Patent Application No. 2008934 dated Apr. 21, 2021.

* cited by examiner

METHOD FOR DESIGNING AN ELECTROSTATIC SEPARATING DEVICE OF A MIXTURE OF DIFFERENT MATERIAL GRANULES AND ASSOCIATED DEVICES

CROSS REFERENCE TO RELATED APPLICATIONS

This is a U.S. patent application which claims priority of French Patent Application No. 2008934 filed on Sep. 3, 2020, which is hereby incorporated by reference.

FIELD OF THE INVENTION

The present invention relates to a method for designing a part of an electrostatic separating device of a mixture of different material granules. The present invention also relates to an electrostatic separating device, a computer program, a readable information medium and a design assembly.

BACKGROUND

Electrostatic separating devices are already used to sort mixed granular materials derived from industrial waste shredding, for example. Typically, the bulk of the material to be separated consists of electric insulating materials, especially plastics.

For example, the recycling of electrical and/or electronic waste involves separating the various components before recycling the materials obtained. It is desirable for this separation to be as efficient as possible, in order to obtain a substantially constant quality of the recycled materials.

When the materials to be separated have the same or very similar densities, separation methods based on gravity are too imprecise and do not allow satisfactory separations to be obtained.

A technique for this is known, which consists in crushing the insulating materials into granules and separating them by electrostatic effect.

In a first step, the granules are charged by triboelectric effect in a vibrating or rotating device. In a second step, the charged granules are conveyed to an electrostatic sorting device where they are separated by an electric field. For this purpose, the granules are injected from the top of the sorting device where they fall between two electrodes.

The positively charged granules are attracted to the anode (the negative electrode), while the negatively charged granules are attracted to the cathode (the positive electrode). The granules thus deflected in their fall are separated and fall into a collection area comprising different collectors, arranged at the bottom of the device and in front of the electrodes.

The number of compartments in the collection area varies, in order to optimize the purity sought. The purest material is found in the compartments located at the ends of the collection area, which receive the most strongly deflected granules, and the most mixed material is found in the most central compartments.

In the current separators, it is common to find that the rate of unseparated material is between 35% and 50%, that is, only 50% to 65% of material is separated in a single pass with a required purity of 95%, for example.

SUMMARY

Thus, there is a need for a method for obtaining or adjusting at least a part of the electrostatic separating device to improve the performance of the separating device.

To this end, the description describes a method for designing a part of an electrostatic separating device of a mixture of different material granules, the device being characterized by device-related parameters, the device-related parameters comprising the parameters of the set of parameters related to the device part, the design method being implemented by computer, the method including a phase of optimizing the parameter values related to the device part, in order to obtain an optimized set of parameters, the optimization phase including:
 providing a sorting performance value to be met by the device when at least one predefined mixture is introduced into the device to be sorted,
 at least one optimization of a value of at least one parameter among the set of parameters related to the device part by means of an optimization technique, the optimization technique including the use of a model associating the device sorting performance with the parameters related to the device, with the optimization technique occurring under the constraint that the sorting performed by the device has the given sorting performance value, to obtain an optimized value for each optimized parameter, the set of optimized parameters being the set of optimized values.

According to particular embodiments, the design method has one or more of the following features, taken alone or in any technically possible combination:
 the device comprises a collection area, the device part being the collection area extending between a first end and a second end, the collection area including dividers that delimit compartments (238) with their ends, the collection area parameters being chosen from among geometric parameters of the collection area and operating parameters of the collection area during the sorting of the mixture, with at least one geometric parameter of the collection area being chosen in particular from the list consisting of:
  the position of the ends,
  the vertical position of the collection area
  the number of dividers,
  the position of each divider, and
  the length of each divider,
 at least one operating collection area parameter during the sorting of the mixture being chosen from the list consisting of:
  the purity of the granules accumulated in each compartment,
  the mass of the granules accumulated in each compartment, and
  the electrical charge of the granules accumulated in each compartment.
 the optimization technique comprises at least one of the following operations:
  calculating the trajectory followed by each granule of the at least one predefined mixture,
  modeling the initial electrical charge distribution of each material of the at least one predefined mixture according to a Gaussian law,
  the modeling of the initial velocity distribution of each material of the at least one predefined mixture according to a Gaussian distribution, and
  modeling the evolution of the position of the granules according to a function depending on the electrical charge of the granules accumulated in each compartment of the device part.
 the device comprises a sorting area, the set of device parameters including at least one parameter chosen from among parameters relating to the sorting area and parameters of operation of the said device during the sorting of the mixture, at least one parameter relating to the sorting area being chosen from the list consisting of:
the voltage of the electrodes,
the drop height,
the rate of introduction of granules,
the entry point of the sorting area, and
at least one operating parameter of said device during the sorting of the mixture being chosen from the list consisting of:
the granule/element restitution coefficient in the sorting area,
the particle/element friction coefficient in the sorting area, and
the drag coefficient.
the sorting performance value is chosen from:
a criterion of mixture purity obtained in one or more compartments of the part of the device,
a criterion of the total efficiency of the device, and
a criterion of the efficiency of the device for one or more specific materials.
the method further includes a phase chosen from a of device part manufacturing phase, having the values of the optimized parameter set, and a device part adjustment phase, so that the device part has the values of the optimized parameter set.

The description also relates to an electrostatic separating device of a mixture of different material granules including a part of the device having parameters relating to the device part, the parameters having the value of the optimized parameter set after implementation of a method for designing a part of the device, as previously described.

The description also relates to a computer program including a readable information medium on which a computer program comprising program instructions is stored, the computer program being loadable on a data processing unit and implementing the optimization phase of a method for designing a part of the electrostatic separating device, as previously described, when the computer program is implemented on the data processing unit.

The description also relates to a readable information medium including program instructions forming a computer program, the computer program being loadable onto a data processing unit and implementing the optimization phase of a method for designing a part of the electrostatic separating device, as previously described, when the computer program is implemented on the data processing unit.

The description also relates to a design assembly capable of designing a part of an electrostatic separating device of a mixture of different material granules, the device being characterized by device-related parameters, the device-related parameters including the parameters of the set of device-related parameters, the design assembly comprising:
a system suitable for optimizing values of a set of parameters related to the device part, to obtain an optimized set of parameters that interact with a computer program, the system being capable of:
receiving a sorting performance value to be met by the device when at least one predefined mixture is introduced into the device to be sorted,
optimizing a value of at least one parameter from among the set of parameters related to the device part, by means of an optimization technique, the optimization technique comprising the use of a model associating the device sorting performance with the parameters related to the device, with the optimization technique implemented under the constraint that the sorting performed by the device has the given sorting performance value, in order to obtain an optimized value for each optimized parameter, the set of optimized parameters being the set of the optimized values,
a unit chosen from a manufacturing unit suitable for manufacturing the device part having the values of the optimized parameter set and an adjustment unit suitable for adjusting the device part to have the values of the optimized parameter set.

In this description, the term "suitable for" means either "capable of", "adapted to" or "configured for".

BRIEF DESCRIPTION OF THE DRAWINGS

Features and advantages of the invention will become apparent from the following description, given only as a non-limiting example, and made with reference to the appended drawings, in which.

DETAILED DESCRIPTION

Figure 1:
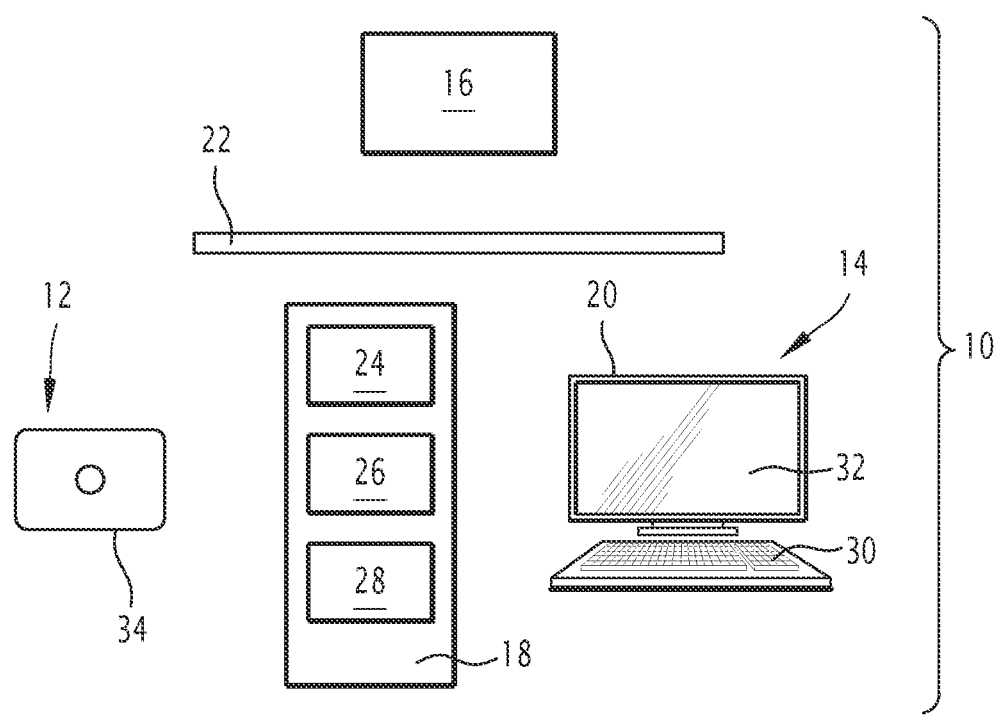
FIG. 1, a schematic representation of a design assembly and a computer program,
FIG. 2, a flow chart of an example of the implementation of a design method by the design assembly of FIG. 1, and
FIG. 3, a schematic representation of an electrostatic separating device.

A design assembly 10 and a computer program 12 are shown in FIG. 1.

The interaction between the design assembly 10 and the computer program 12 enables the implementation of a method for designing a part of a device for electrostatically separating a mixture of granules of different materials. The design method is thus a method implemented by computer.

The design assembly 10 includes a system 14 and a manufacturing unit 16.

The system 14 is a desktop computer. In a variant, the system 14 is a rack-mounted computer, a laptop, a tablet, a personal digital assistant (PDA), or a smartphone.

In the case of FIG. 1, the system 14 comprises a computer 18, a user interface 20, and a communication device 22.

The computer 18 is an electronic circuit designed to manipulate and/or transform data, shown as electronic or physical quantities in registers of the system 14 and/or memories, into other similar data corresponding to physical data in the memories of registers or other types of display devices, transmission devices, or storage devices.

As specific examples, the computer 18 comprises a single-core or multi-core processor (such as a central processing unit (CPU), a graphics processing unit (GPU), a microcontroller, and a digital signal processor (DSP)), a programmable logic circuit (such as an application-specific integrated circuit (ASIC), a field programmable gate array (FPGA), a programmable logic device (PLD), and programmable logic arrays (PLAs)), a state machine, a logic gate, and discrete hardware components.

The computer 18 comprises a data processing unit 24 suitable for processing data, including making calculations, memories 26 suitable for storing data, and a reader 28 suitable for reading a computer readable medium.

The user interface 20 comprises an input device 30 and an output device 32.

The input device 30 is a device that allows the user of the system 14 to input information or commands into the system 14.

In FIG. 1, the input device 30 is a keyboard. In a variant, the input device 30 is a pointing device (such as a mouse, touchpad, and graphic tablet), a voice recognition device, an eye tracker, or a haptic (motion analysis) device.

The output device 32 is a graphical user interface, that is, a display unit designed to provide information to the user of the system 14.

In FIG. 1, the output device 32 is a display screen for visual presentation of the output. In other embodiments, the output device 32 is a printer, an augmented and/or virtual display unit, a speaker or other sound generating device for presenting the output in sound form, a vibration and/or odor producing unit, or a unit suitable for producing an electrical signal.

In one specific embodiment, the input device 30 and the output device 32 are the same component forming human-machine interfaces, such as an interactive display.

The communication device 22 allows for one-way or two-way communication between the components of the system 14. For example, the communication device 22 is a bus communication system or an input/output interface.

The presence of the communication device 22 allows the components of the computer 18 to be remote from each other, in some embodiments.

The computer program 12 comprises a computer-readable medium 34.

The computer-readable medium 34 is a tangible device readable by the reader 28 of the computer 18.

Notably, the computer-readable medium 34 is not a transient signal per se, such as radio waves or other freely propagating electromagnetic waves, such as light pulses or electronic signals.

Such a computer-readable storage medium 34 is, for example, an electronic storage device, a magnetic storage device, an optical storage device, an electromagnetic storage device, a semiconductor storage device or any combination thereof.

As a non-exhaustive list of more specific examples, the computer-readable storage medium 34 is a mechanically encoded device, such as punched cards or embossed structures in a groove, a floppy disk, a hard disk, a read-only memory (ROM), a random access memory (RAM), an erasable programmable read-only memory (EROM) electrically erasable and readable memory (EEPROM), magneto-optical disk, static random access memory (SRAM), compact disk (CD-ROM), digital versatile disk (DVD), USB flash drive, floppy disk, flash memory, solid-state drive (SSD), or a PC card such as a PCMCIA memory card.

A computer program is stored on the computer-readable storage medium 34. The computer program includes one or more sequences of stored program instructions.

Such program instructions, when executed by the data processing unit 24, cause steps of the design method to be executed.

For example, the form of the program instructions is a source code form, a computer executable form, or any intermediate form between a source code and a computer executable form, such as the form resulting from conversion of the source code via an interpreter, assembler, compiler, linker, or localizer. In a variant, the program instructions are microcode, firmware instructions, state definition data, integrated circuit configuration data (such as, VHDL) or object code.

The program instructions are written in any combination of one or more languages, such as an object-oriented programming language (FORTRAN, C++, JAVA, HTML), a procedural programming language (such as C language).

In a variant, the program instructions are downloaded from an external source via a network, as is the case for applications. In this case, the computer program comprises a computer-readable data medium on which the program instructions are stored or a data medium signal on which the program instructions are encoded.

In each case, the computer program 12 comprises instructions that can be loaded into the data processing unit 24 and suitable for causing the design method to be executed when executed by the data processing unit 24. Depending on the embodiment, the execution is performed entirely or partially either on the system 14, that is, a single computer, or in a distributed system among multiple computers (including via the use of cloud computing).

The manufacturing unit 16 is suitable for manufacturing a part of an electrostatic separating device based on a well-chosen parameter set.

Examples of corresponding parameter sets are given in the following description.

According to one variant, the manufacturing unit 16 is suitable for manufacturing all parts of an electrostatic separating device with additional parameters relating to other parts of the device.

An example of such a part is the collection area.

The operation of the design assembly 10 is now described with reference to FIG. 2, which is a flow chart illustrating an example embodiment of the design method.

The design method is intended to design a part of an electrostatic separating device of a mixture of different material granules with improved properties.

The design method is implemented by computer, so that the method can be referred to as a computer-aided method. Such a method is often referred to as a CAD method, the abbreviation CAD referring to the English name, "Computer Aided Design".

The design method also corresponds to a method for developing a part of a device for electrostatically separating a mixture of granules of different materials.

Figure 3:
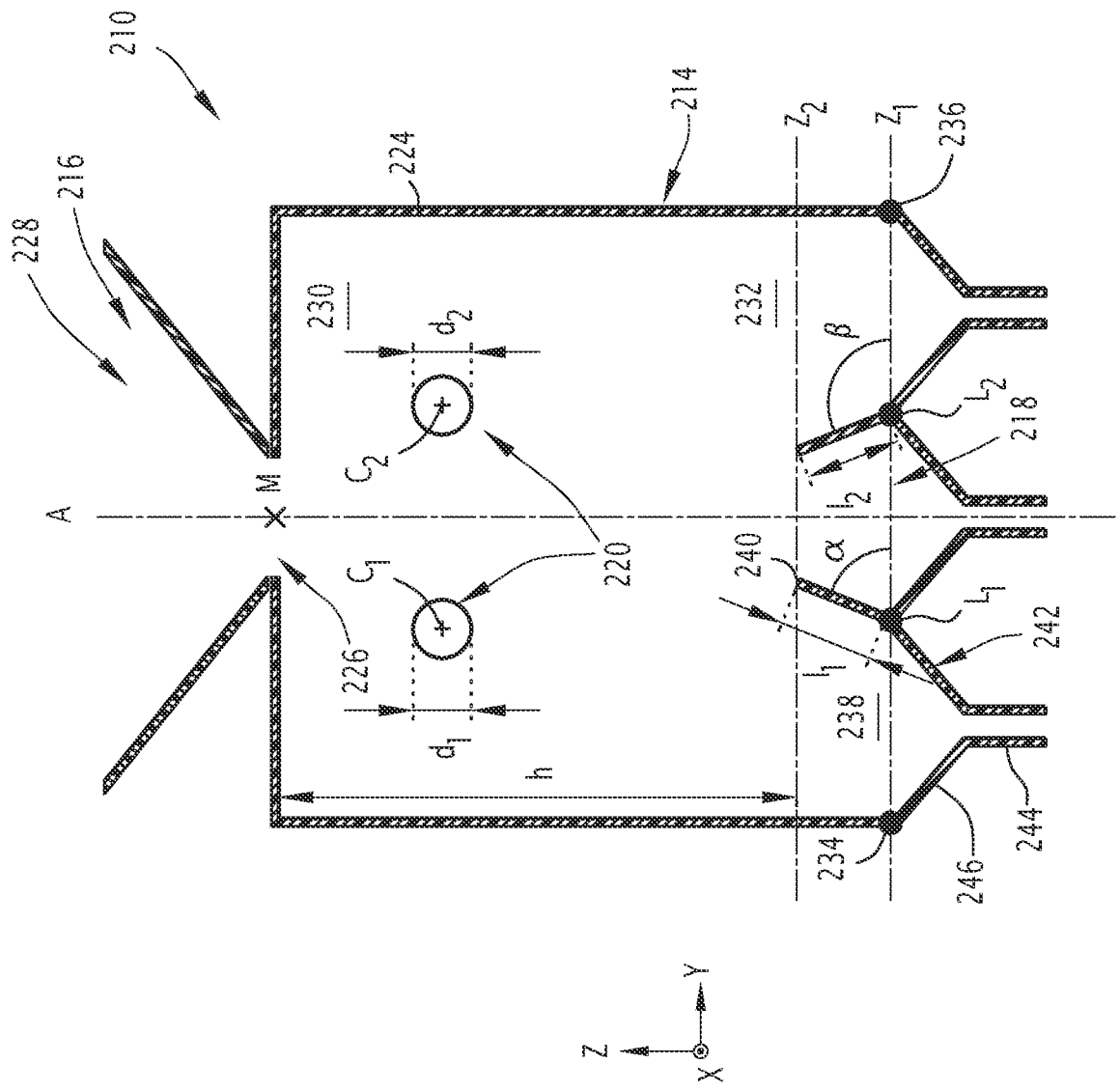

The separating device 210 is shown in FIG. 3. The device 210 is suitable for separating a mixture of granules.

The device 210 is described with reference to an elevation direction Z, oriented according to gravity, as well as a longitudinal direction X and a transverse direction Y perpendicular to each other and to the elevation direction Z.

The device 210 comprises a separation chamber 214, a granule collection area 218, electrodes 220, and a potential difference generating system, not shown in FIG. 3 for clarity of the Figure.

By the term "separating the mixture of granules" it is understood that the device 210 is suitable for sorting at least a part of the granules comprising the mixture based on the composition of said granules.

The mixture of granules comprises granules of at least two different materials.

The term "granule" is understood as a particle having a substantially compact shape, composed of at least one material. A granule has characteristic millimeter dimensions. For example, each granule has lengths, measured in each direction, of between 1 millimeter (mm) and 16 mm.

In particular, the mixture comprises granules of various shapes and sizes, according to a normal size distribution centered around the above characteristic dimensions, for example.

By the expression "granules of at least two different materials", it is understood that the mixture comprises at least a first population of granules predominantly comprising a first material, for example, and a second population of granules predominantly comprising a second material, the second material being distinct from the first material.

By the term "predominantly" it is understood that each granule of the first population comprises at least 90% of the mass of the first material, for example, or that each granule of the second population comprises at least 90% of the mass of the second material.

According to the example proposed, the first material and the second material are electrically insulating materials, including plastic materials.

For example, the first material and the second material are chosen from the group consisting of polypropylene, polystyrene, polyamide, acrylonitrile butadiene styrene and polyethylene.

The mixture of granules is obtained by shredding, for example waste in particular, more specifically of industrial waste, from electrical and/or electronic equipment or from end-of-life vehicles.

The separation chamber 214 is a compartment suitable for containing and isolating the mixture during the separation of the granules.

In particular, the separation chamber 214 is suitable for protecting the mixture of granules from variations in temperature, pressure, humidity, and electric field outside the chamber during separation.

The separation chamber 214 comprises walls 224 that bound an interior volume and define an inlet 226.

The separation chamber 214 comprises a device for introducing 228 the granules through the inlet 226.

The separation chamber 214 contains the collection area 218.

The separation chamber 214 extends along a central axis A, substantially parallel to the elevation direction Z, through the inlet 226 and the collection area 218.

The separation chamber 214 comprises a high part 230 and a low part 232, relative to gravity.

The high part 230 is the part of the separation chamber 214 extending above the electrodes 220 along the elevation direction Z, for example.

The lower part 232 is the part of the separation chamber 214 extending below the electrodes 220, for example, along the elevation direction Z.

It should be noted that the part of the separation chamber 214 that is not in the collection area 218, the end of which is marked by a line Z2, is the sorting area ZT.

The inlet 226 is an opening in the walls 224 located in the upper part 230 of the separation chamber 214, relative to the elevation direction Z.

The inlet 226 is provided with the introduction device 228.

The introduction device 228 is suitable for introducing the granules into the separation chamber 214 through the inlet 226.

The introduction device 288 is a vibrating hopper in to the example shown, comprising hopper sides and at least one actuator.

The hopper sides define a frustoconical inner space, with an axis parallel to the elevation direction Z and converging toward the inlet 226 of the separation chamber 214.

The one or more actuators are vibratory motors, arranged to vibrate the sidewalls, to facilitate the flow of granules to the inlet 226.

According to other embodiments, the feeder 228 comprises a belt conveyor or vibrating table.

The collection area 218 is suitable for receiving the granules after the granules have passed through the separation chamber 214.

The collection area 218 is contained within the interior volume, and located in the lower part 232 of the separation chamber 214.

The collection area 218 thus extends between a first end 234 and a second end 236.

The two ends 234 and 236 of the collection area 218 are aligned along a straight line noted Z1 in FIG. 3.

The collection area 218 comprises a plurality of compartments aligned along the bottom 232 of the separation chamber 214 along the transverse direction Y.

The compartments are substantially parallelepipedal granule receiving spaces aligned along the transverse direction Y and separated from each other by dividers 240 or flaps that are part of the collection area 218.

Each compartment is arranged to receive a part of the granules from the separation chamber 214.

The part of the granules received by the compartment 238 depends on a deflection of the granules in the separation chamber 214 and a position of the compartment 238 in the lower part 232 of the separation chamber 214.

Advantageously, each compartment 238 comprises a granule removal device 242 suitable for continuously removing granules received by the compartment 238.

The discharge devices 242 allow the separating device to operate continuously.

Each discharge device 242 comprises a pipe opening into the bottom of compartment 238 through a flare 246, for example, as well as a member (not shown) for circulating the granules through pipe 244, such as a pump.

The electrodes 220 are suitable for generating an electric field at the central axis A.

The electric field generated by the electrodes 220 deflects the granules passing through the separation chamber 214.

The anode is an electrode suitable for receiving an electrical potential imposed by the generating system.

The cathode is also an electrode suitable for receiving an electrical potential imposed by the generation system, the electrical potential of the cathode being greater than the electrical potential of the anode.

The cathode is arranged on the same side of the central axis A, this side being opposite the anode side. The cathode is thus positioned so as to face the anode.

The generating system is suitable for generating a difference in electric potential between the anode and the cathode, so as to form an electric field in the separation chamber 214 derived from the potential differences.

The electric field formed has sufficient strength to deflect the granules exhibiting surface charge and direct them to different the compartments 238 of the collection area 18, to implement the separation.

Thus, the generating system is suitable for deflecting granules having a positive surface charge to the anode and granules having a negative surface charge to the cathode.

Figure 2:
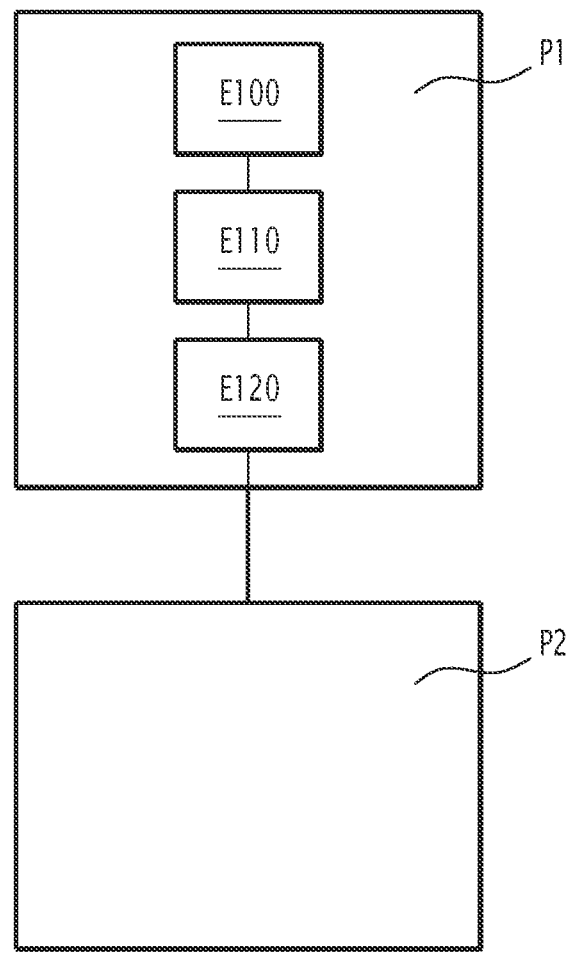

With reference to FIG. 2, the design method comprises two phases P1 and P2, an optimization phase P1 and a manufacturing phase P2.

The optimization phase P1 aims to optimize at least one parameter characterizing the collection area 218.

The parameters of the collection area 218 are chosen from geometric parameters of the collection area 218 and operating parameters of the collection area 218 during sorting of said at least one mixture.

A geometric parameter of the collection area 218 is chosen from the list consisting of the position of the ends 234 and 236, the vertical position of the collection area 218, the number of dividers 240, the position of each divider 240 and the length of each divider 240.

According to the example in FIG. 3, the position of each divider 240 is given by the coordinates of points L1 and L2 and the value of the angle (a and p, respectively, in FIG. 3) formed by the divider 240 and the line Z1.

The respective length of each divider 240 is noted as l1 and l2 in FIG. 3.

An operating parameter of the collection area 218 during sorting of said at least one mixture is chosen from the list consisting of the purity of the granules accumulated in each compartment 238, the mass of the granules accumulated in each compartment 238, and the electrical charge of the granules accumulated in each compartment 238.

The optimization phase P1 thus corresponds to a phase of determining the values of a set of parameters relating to the collection area 218.

In the example described, the optimization phase P1 comprises a first supply step E100, a second supply step E110 and an optimization step E120.

In the first supply step E100, initial values for the parameters relating to the device 210 are provided.

The device-related parameters 210 are the parameters characterizing (or related to) each part of the device 210.

In the present case, the parameters related to the device 210 are the parameters of the collection area 218, the parameters related to the sorting area ZT, and an operating parameter of the device 210 when sorting a mixture.

The parameter related to the sorting area ZT is chosen from the list consisting of electrode voltage 220, electrode positioning 220, electrode shape 220, number of electrode pairs 220, drop height, granule introduction rate and sorting area ZT entry point 226.

In FIG. 3, examples of parameters are shown. Thus, it appears that the shape of the electrodes 220 is characterizable by a disk having a diameter D1 or D2, depending on the electrode 220 considered, and that the positioning of the electrodes 220 is characterizable by the coordinates in the (Y, Z) plane of the centers C1 and C2 of the electrodes 220.

The drop height is defined as the distance between the inlet 226 of the separation chamber 214 (marked by point M in FIG. 3) and the end of the highest divider 240 along the elevation axis Z (marked by mixed line Z2 in FIG. 3). In other words, the drop height is the distance between point M and line Z2.

This drop height is denoted by h.

The operating parameter of the device 210 when sorting a mixture is chosen from the electrode voltage 220, the granule/element restitution coefficient in the sorting area ZT, the particle/element friction coefficient in the sorting area ZT and the drag coefficient.

The collection area parameters 218 considered for the optimization phase are the parameters for manufacturing (or adjusting) the collection area 218. Such manufacturing parameters are referred to in the following as the parameter set.

According to the proposed example, the first supply step is implemented by receiving data entered by the system user on the input device.

In the second supply step E110, a sorting performance value to be met by the device 210 is provided when at least one predefined mixture is introduced into the device 210 for sorting.

In other words, the performance value is an assessment of the performance or quality of operation of the device 210.

Generally speaking, the performance of the method can be defined as the amount of separated material over the amount of total material introduced into the separator, that is, the amount recovered in the compartments 238 not dedicated to mixture recovery (in the center) over the total amount of material introduced.

Thus, for example, the sorting performance value is chosen from a criterion of the purity of the mixture obtained in one or more compartments 238 of the part of the device 210, a total yield criterion of the device 210, and a yield criterion of the device 210 for one or more specific materials.

Preferably, the sorting performance value is evaluated according to a combination of the foregoing criteria, to take into account the significance of both yield and purity for the present device 210.

In optimization step E120, a value of at least one of the set of parameters relating to the collection area 218 is optimized, using an optimization technique.

Specifically, the technique includes the use of a model related to the parameters associating the sorting performance of the device 210 with the device 210, and is implemented under the constraint that the sorting performed by the device 210 has the given sorting performance value.

This results in an optimized value for each optimized parameter, where the optimized parameter set is the set of optimized values.

The optimization technique may include any of the following: calculating the trajectory followed by each granule of the at least one predefined mixture, modeling the initial electrical charge distribution of each material of the at least one predefined mixture according to a Gaussian distribution, modeling the initial velocity distribution of each material of the at least one predefined mixture according to a Gaussian distribution, and modeling the evolution of the position of the granules according to a function depending on the electrical charge of the granules accumulated in each compartment 238 of the part of the device 210.

More generally, the optimization technique uses a model reproducing a binary mixture of charged particles whose motion equations will be solved for each particle crossing the sorting area ZT and reaching the collection area 218. The trajectories will thus be calculated for each particle, which allows the particles fallen in each compartment 238 of the collection area 218 to be counted.

As an example model, a modelling based on Newton's law may be applied to each of the particles introduced into the separator, to which the following forces apply: gravity, drag force and electrical force.

To calculate the trajectory of a single particle of mass m subjected to the earth's gravity falling into an electric field E, we solve the equation given by Newton's second law, namely:

$$\sum_i F = ma$$

In the previous expression, the forces in sum are four in number and are:
gravity, which is written: $F_g=mg$;
the drag force, which is written:

$$F_d = \frac{1}{2}\rho_{air}AC_d v|v|$$

with $A=\pi r^2$ where r is the radius of the particle, $\rho_{air}$ the density of the air, $C_d$ the drag coefficient and v the velocity of the particle,
the electric force $F_q=qE$ where E is the gradient vector of the voltage and q the charge of the particle (in coulomb), To find the velocity u and the position x of the particle, the acceleration vector a is integrated with the Euler method. To perform the integration, initial values of the velocity $u_0$ and the position $x_0$ must be given.

The electric field is modeled by the Laplace equation whereby the potential (equivalent to the voltage of the generating system) verifies:

$$E=-\nabla\phi et\phi=0$$

To solve this equation, we rely on OpenFOAM2 (Open Field Operation And Manipulation), which is an open-source code.

The contact force between the particles as well as the walls and electrodes 220 is modeled according to the Hertz model (taking into account the elastic deformations of the particle and the surfaces):

$$F=(k_n\delta n_{ij}-\gamma_n vn_{ij})+(k_t\delta t_{ij}-\gamma_t vt_{ij})$$

In the previous expression, the first parenthesis is the normal force, with the first term being the overlap and the second term being the relative velocity. Similarly, the second parenthesis corresponds to the tangential force, with the first term being the overlap and the second term being the relative velocity.

The following notations are used:
$\delta n_{ij}$ denotes the normal overlap between two particles,
$k_n$ the elastic constant for normal contact,
$\gamma_n$ the viscoelastic damping constant for normal contact,
$vn_{ij}$ the normal displacement vector between two spherical particles,
$\delta n_{ij}$ denotes the tangential overlap between two particles,
$k_n$ the elastic constant for tangential contact,
$\gamma_n$ the viscoelastic damping constant for a tangential contact, and
$vn_{ij}$ the tangential displacement vector between two spherical particles.

In the optimization technique, one constraint is that the parameters related to the mixture are fixed.

Taking the case of a mixture of particles A and B, the following parameters are kept fixed:
particle introduction rate (which corresponds to the flow rate),
particle/particle restitution coefficient,
particle/element restitution coefficient in the sorting area ZT,
particle/particle friction coefficient,
particle/element friction coefficient in the sorting area ZT,
electric charge of the particles A (more or less distributed according to a Gaussian model with a given mean and standard deviation),
initial velocity of particles A (more or less distributed according to a Gaussian model with a given mean and standard deviation)
electric charge of particles B (more or less distributed according to a Gaussian model with a given mean and standard deviation),
initial velocity of particles B (more or less distributed according to a Gaussian model with a given mean and standard deviation),
size of particles A,
size of particles B,
number of particles A,
number of particles B,
density of particles A, and
density of particles B.

An optimized value for the parameter is thus obtained.

According to a variant, the optimization technique is used to vary two parameters.

The optimization technique then uses a cost function, given by a least square technique, for example.

In the manufacturing phase, the manufacturing unit 16, having the values of the optimized parameter set, manufactures the collection area 218.

Alternatively, the method includes a phase of adjusting the collection area 218 so that the collection area 218 has the values of the optimized parameter set.

In each case, the collection area 218 is optimized for the desired use and in particular for the type of mixture to be sorted.

To do this, the method takes inputs in terms of composition, load, or size, simulates separation, discretizes the collection area 218 into a number of compartments 238, determines the load and mass distribution in each compartment 238 of the collection area 218, and identifies the appropriate combination of compartment(s) 238 based on the required purity criterion for each material.

This method therefore provides better yields for the resulting device 210 with good reproducibility.

10,000 particle simulations give results that are reproducible to the nearest tenth of a percent.

It should be noted that the finer the discretization of the collection area 218, the higher the efficiency.

This factor can be used by refining the ideal position of the divider 240, either by increasing the number of compartments 238 simulated or by digitally "zooming in" on the area of interest. Indeed, it is possible to simulate the result again by focusing on only a fraction of the collection area 218 by defining the exact position of the compartments 238.

With the method, the collection area 218 of the sorting area ZT can also be improved. The improvement may be geometric (size, number of compartments 238, shape of dividers 240) or functional (multiple streams >3). For example, it is possible to separate three materials in a single sorting step by triboelectricity. Indeed, a fine knowledge of the charge distribution curves and particle trajectory according to their charge may lead to definition of sub-domains in the part of the same sign.

Finally, the method can be adapted according to similar alternative formulations.

As an example, analysis of the separation results allows the mass charge to be linked to the position along the collection area 218. Knowing the initial velocity of each particle, a deviation function specific to each sorting area ZT can be deduced, allowing the output position to be determined as a function of loading the mass at the inlet 226.

Thus, in a variant, to achieve the same result, the method may take inputs in terms of composition, load, or size, define a sorting area ZT, determine the deviation function of the sorting area ZT, plot the load distributions, determine the related domains based on the desired purity criterion for each material, set the dividers 240 according to the deviation function, and simulate separation in the sorting area ZT and check the appropriateness of the settings of the dividers 240.

The invention claimed is:

1. A method for manufacturing a collection area of an electrostatic separating device of a mixture of different material granules, the electrostatic separating device being characterized by electrostatic separating device parameters and the collection area being characterized by collection area parameters, the collection area extending between a first end and a second end, the collection area including dividers delimiting compartments with the ends,
   the collection area parameters being chosen from geometric parameters of the collection area and operating parameters of the collection area during the sorting of the mixture,
   each geometric parameter being chosen in the list consisting of the position of the ends, the vertical position of the collection area, the number of dividers, the position of each divider, and the length of each divider, and
   each operating parameter being chosen in the list consisting of the purity of the granules accumulated in each compartment and the mass of the granules accumulated in each compartment,
   the method for manufacturing comprising a computer-implemented phase of optimizing the values of the collection area parameters and a phase of manufacturing a collection area by a manufacturing unit,
   the phase for optimizing comprising:
      providing a sorting performance value to be met by the electrostatic separating device when at least one predefined mixture to be sorted is introduced into the electrostatic separating device, and
      at least one optimization of a value of at least one parameter from the set of electrostatic separating device parameters using an optimization technique, the optimization technique including the use of a model associating the sorting performance of the electrostatic separating device,
   the optimization technique being implemented with the electrostatic separating device parameters, under the constraint that the sorting performed by the electrostatic separating device has the provided sorting performance value, in order to obtain an optimized value for each collection area parameter,
   the optimization technique further comprising:
      calculating the trajectory followed by each granule of the at least one predefined mixture,
      modeling the initial electric charge distribution of each material of the at least one predefined mixture according to a Gaussian distribution,
      modeling the initial velocity distribution of each material of the at least one predefined mixture according to a Gaussian distribution, and
      modeling the evolution of the position of the granules according to a function depending on the electrical charge of the granules accumulated in each compartment of the collection area,
   the phase of manufacturing comprising physically manufacturing the collection area having the optimized collection area parameters.

2. The method according to claim 1, wherein the electrostatic separating device further comprises a sorting area, wherein the set of parameters of the electrostatic sorting device comprises at least one parameter chosen from among parameters relating to the sorting area and operating parameters of said device during the sorting of the mixture,
   at least one parameter relating to the sorting area being chosen from the list consisting of:
      the voltage of the electrodes,
      the drop height,
      the granule introduction rate,
      the entry point of the sorting area, and
   at least one operating parameter of said device during the sorting of the mixture being chosen from the list consisting of:
      the granule/element restitution coefficient in the sorting area,
      the particle/element friction coefficient in the sorting area, and
      the drag coefficient.

3. The method according to claim 1, wherein choosing the sorting performance value is chosen from:
   a criterion of the mixture purity obtained in one or more compartments of the device part,
   a criterion of the total efficiency of the device, and
   a criterion of the yield of the device for one or more specific materials.

4. A method for adjusting a collection area of an electrostatic separating device of a mixture of different material granules, the electrostatic separating device being characterized by electrostatic separating device parameters and the collection area being characterized by collection area parameters, the collection area extending between a first end and a second end, the collection area including dividers delimiting compartments with the ends,
   the collection area parameters being chosen from geometric parameters of the collection area and operating parameters of the collection area during the sorting of the mixture,
   each geometric parameter being chosen in the list consisting of the position of the ends, the vertical position of the collection area, the number of dividers, the position of each divider, and the length of each divider, and
   each operating parameter being chosen in the list consisting of the purity of the granules accumulated in each compartment and the mass of the granules accumulated in each compartment,
   the method for adjusting comprising a computer-implemented phase of optimizing the values of the collection area parameters and a phase of adjusting a collection area by an adjusting unit,
   the phase for optimizing comprising:
      providing a sorting performance value to be met by the electrostatic separating device when at least one predefined mixture to be sorted is introduced into the electrostatic separating device, and
      at least one optimization of a value of at least one parameter from the set of electrostatic separating device parameters using an optimization technique, the optimization technique including the use of a model associating the sorting performance of the electrostatic separating device,
   the optimization technique being implemented with the electrostatic separating device parameters, under the constraint that the sorting performed by the electrostatic separating device has the provided sorting performance value, in order to obtain an optimized value for each collection area parameter, the optimization technique further comprising:
- calculating the trajectory followed by each granule of the at least one predefined mixture,
- modeling the initial electric charge distribution of each material of the at least one predefined mixture according to a Gaussian distribution,
- modeling the initial velocity distribution of each material of the at least one predefined mixture according to a Gaussian distribution, and
- modeling the evolution of the position of the granules according to a function depending on the electrical charge of the granules accumulated in each compartment of the collection area, the phase of adjusting comprising a step of physically providing the electrostatic separating device with the collection area and a step of physically adjusting the provided collection area so that the collection area parameter have the value of the optimized collection area parameters.

5. The method according to claim 4, wherein the electrostatic separating device further comprises a sorting area, wherein the set of parameters of the electrostatic sorting device comprises at least one parameter chosen from among parameters relating to the sorting area and operating parameters of said device during the sorting of the mixture,
- at least one parameter relating to the sorting area being chosen from the list consisting of:
  - the voltage of the electrodes,
  - the drop height,
  - the granule introduction rate,
  - the entry point of the sorting area, and
- at least one operating parameter of said device during the sorting of the mixture being chosen from the list consisting of:
  - the granule/element restitution coefficient in the sorting area,
  - the particle/element friction coefficient in the sorting area, and
  - the drag coefficient.

6. The method according to claim 4, wherein choosing the sorting performance value is chosen from:
- a criterion of the mixture purity obtained in one or more compartments of the device part,
- a criterion of the total efficiency of the device, and
- a criterion of the yield of the device for one or more specific materials.

* * * * *